(12) United States Patent
Stribling

(10) Patent No.: US 10,367,449 B2
(45) Date of Patent: Jul. 30, 2019

(54) MICRO-CONCENTRATOR MODULE AND DEPLOYMENT METHOD

(71) Applicant: The Boeing Company, Chicago, IL (US)

(72) Inventor: Ray A. Stribling, Redondo Beach, CA (US)

(73) Assignee: The Boeing Company, Chicago, IL (US)

( * ) Notice: Subject to any disclaimer, the term of this patent is extended or adjusted under 35 U.S.C. 154(b) by 507 days.

(21) Appl. No.: 15/046,718

(22) Filed: Feb. 18, 2016

(65) Prior Publication Data

US 2017/0244356 A1   Aug. 24, 2017

(51) Int. Cl.
*H02S 30/10* (2014.01)
*H02S 30/20* (2014.01)
*H02S 40/22* (2014.01)
*H01L 31/054* (2014.01)

(52) U.S. Cl.
CPC .......... *H02S 40/22* (2014.12); *H01L 31/0547* (2014.12); *H02S 30/10* (2014.12); *H02S 30/20* (2014.12); *Y02E 10/52* (2013.01)

(58) Field of Classification Search
CPC . H01L 31/0547; H01L 31/0488; H02S 30/10; H02S 30/20; H02S 40/22; B64G 1/222; B64G 1/44; B64G 1/443; F24J 2002/1066; F24J 2/1052
USPC .................................. 136/243–265, 290–293
See application file for complete search history.

(56) References Cited

U.S. PATENT DOCUMENTS

| | | | |
|---|---|---|---|
| 5,167,724 A | 12/1992 | Chiang | |
| 5,482,568 A | 1/1996 | Hockaday | |
| 5,496,414 A | 3/1996 | Harvey et al. | |
| 7,297,865 B2 | 11/2007 | Terao et al. | |
| 7,569,764 B2 | 8/2009 | Shan et al. | |
| 8,636,253 B1 | 1/2014 | Spence et al. | |
| 9,190,554 B2 | 11/2015 | Schmid et al. | |
| 2002/0145185 A1* | 10/2002 | Shrauger ............ | H01L 31/0203 257/678 |
| 2004/0016454 A1* | 1/2004 | Murphy ................ | B64G 1/443 136/244 |

(Continued)

FOREIGN PATENT DOCUMENTS

| | | |
|---|---|---|
| EP | 2911208 A1 | 8/2015 |
| WO | 2010124078 A3 | 10/2010 |
| WO | WO-2015187739 A1 * 12/2015 | ......... H01L 31/0547 |

OTHER PUBLICATIONS

Singer et al., "Micro-Concentrator Solar Array Using Micro-Electromechanical Systems (MEMS) Based Reflectors," U.S. Appl. No. 14/532,356, filed Nov. 4, 2014, 53 pages.

(Continued)

*Primary Examiner* — Andrew J Golden
(74) *Attorney, Agent, or Firm* — Yee & Associates, P.C.

(57) ABSTRACT

A micro-concentrator module includes a cover glass provided with solar cells on one side thereof. The cover glass is adapted to hover above a substrate containing an array of MEMS based reflectors. Springs between the cover glass and the substrate displace the cover glass from a stowed position during transport to a deployed operational position above the substrate. Tethers connecting the cover glass with the substrate limit the displacement of the cover glass to a distance corresponding to the focal length of the reflectors.

20 Claims, 8 Drawing Sheets

FIG. 8A

(56) References Cited

U.S. PATENT DOCUMENTS

| | | |
|---|---|---|
| 2008/0121269 A1 | 5/2008 | Welser et al. |
| 2008/0185034 A1 | 8/2008 | Corio |
| 2009/0277493 A1 | 11/2009 | Merkle |
| 2009/0301544 A1* | 12/2009 | Minelli .............. H01L 31/048 136/244 |
| 2011/0203653 A1* | 8/2011 | Johnson ............ H01L 31/0488 136/256 |
| 2014/0261631 A1* | 9/2014 | Morgan ............ H01L 31/0525 136/246 |
| 2015/0068584 A1 | 3/2015 | Sweatt et al. |
| 2015/0243819 A1 | 8/2015 | Karam et al. |
| 2015/0243822 A1 | 8/2015 | Karam et al. |

OTHER PUBLICATIONS

Singer et al., "Method and Apparatus for Calibrating a Micro-Concentrator Solar Array," U.S. Appl. No. 14/656,259, filed Mar. 12, 2015, 97 pages.

Singer et al., "Dynamically Setting a Threshold Output Level for a Solar Array," U.S. Appl. No. 14/656,303, filed Mar. 12, 2015, 95 pages.

Extended European Search Report, dated Jun. 22, 2017, regarding Application No. 17153097.5, 8 pages.

* cited by examiner

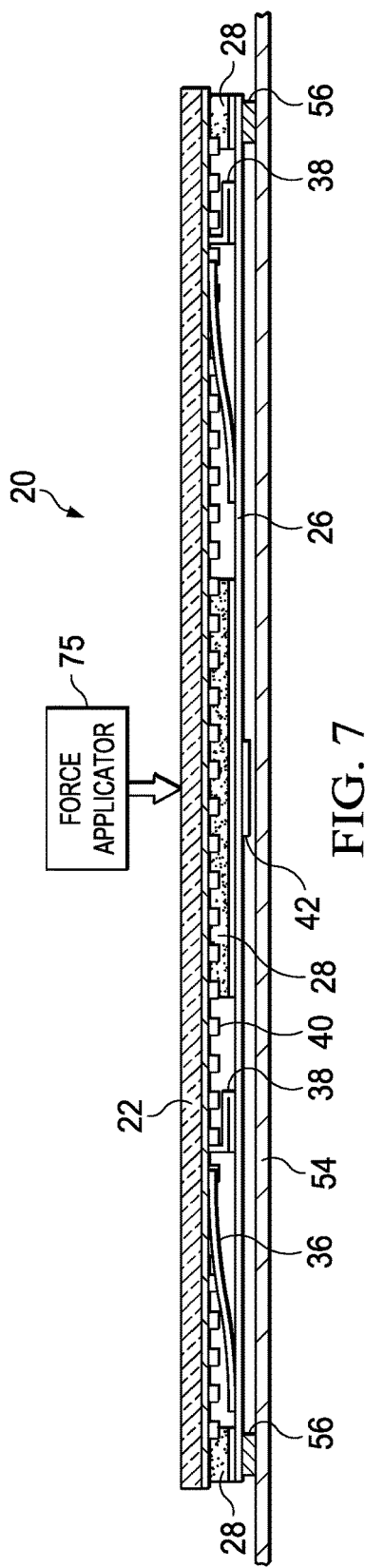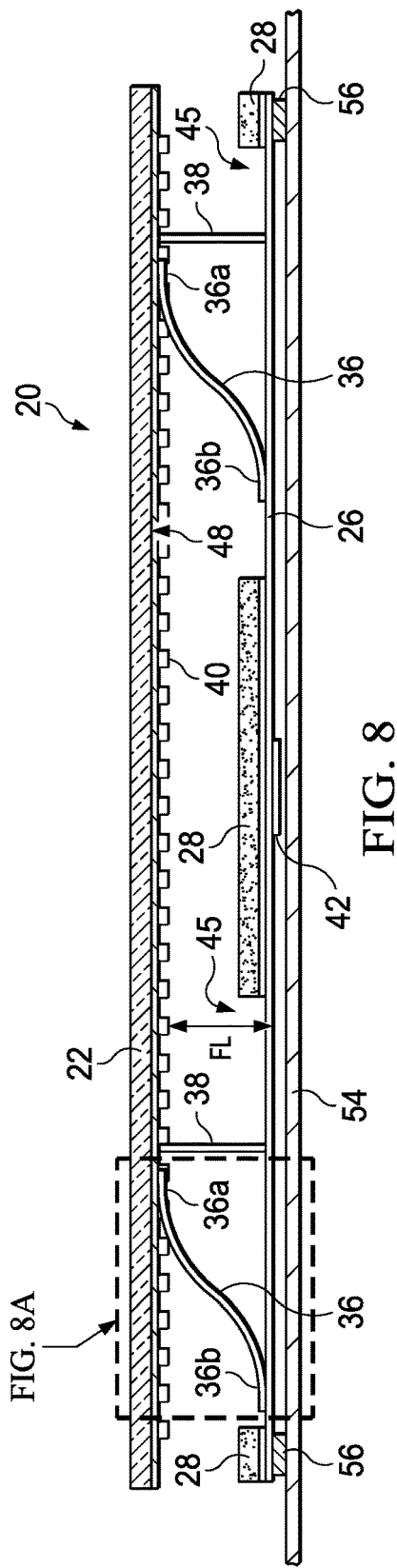

MICRO-CONCENTRATOR MODULE AND DEPLOYMENT METHOD

BACKGROUND INFORMATION

1. Field

The present disclosure generally relates to solar energy collectors, particularly those employing micro-concentrators, and deals more particularly with a micro-concentrator module that can be stowed and deployed on command.

2. Background

MEMS (micro-electromechanical systems) based micro-concentrator modules have been devised that increase solar energy conversion efficiency by employing MEMS controlled reflectors that track and concentrate solar radiation on an array of solar cells. These modules comprise a transparent cover glass spaced above an underlying substrate. An array of solar cells arranged on the underside of a cover glass are aligned with a corresponding array of MEMS based reflectors located on the substrate. The cover glass and underlying substrate are held in fixed, spaced-apart relationship to each other, either by mounting the cover glass and substrate in a rigid frame, or by connecting them with rigid spacers, such as screws located at the corners of the cover glass/substrate. The spacing between the cover glass and substrate is such that the solar cells are respectively positioned at the focal points of the MEMS-based reflectors.

The MEMS based concentrator modules described above, while effective, have limitations when employed for certain applications, such as solar collectors used by spacecraft in deep space. In spacecraft applications, the spacing required between solar cells and MEMS based reflectors result in a module that requires a relatively large volume of spacecraft during launch. Moreover, known MEMS based concentrator model modules are relatively delicate and may be undesirably affected by compression and/or acoustic loads encountered during spacecraft launch.

Accordingly, there is a need for MEMS based concentrator modules that may be stowed to displace minimum volumes during launch of a spacecraft, but may be later deployed to operate normally while in deep space. There is also a need for a related method of stowing MEMS based concentrator modules during launch, and subsequently deploying them while in space.

SUMMARY

A MEMS-based solar micro-concentrator module has a thin cover glass with miniature solar cells that hover above an array of MEMS based concentrators. In order to survive G-forces and compression/acoustic loads during spacecraft launch, the module is stowed in a collapsed condition. Following launch while in space, the module may be deployed to an expanded operating position, in which a cover glass containing solar cells is displaced away from an underlying substrate containing MEMS based reflectors that concentrate and reflect incident solar radiation onto the solar cells. Leaf springs bias the cover glass away from the underlying substrate during deployment and also act as an electrical connection between the solar cells and a circuit on a substrate that processes electrical power produced by the solar cells. Flexible, collapsible tethers connecting the cover glass with the substrate constrain the cover glass to limit its displacement away from substrate during deployment such that the solar cells are located and held at the focal length of the MEMS based reflectors.

According to one disclosed example, a micro-concentrator module is provided, comprising a cover glass and a plurality of solar cells located on one side of the cover glass. The cover glass is adapted to hover over a substrate that includes an array of micro-electromechanical systems (MEMS) based reflectors. The module also comprises a plurality of springs connecting the cover glass and the substrate, and a plurality of tethers connecting the cover glass with the substrate.

According to another disclosed example, a micro-concentrator solar array module is provided comprising a substrate, an array of micro-electromechanical systems (MEMS) based reflectors on the substrate, and a cover glass. The module also includes a plurality of solar cells located on one side of the cover glass, and a plurality of springs biasing the cover glass to shift from a stowed position to a deployed position spaced above the MEMS based reflectors.

According to still another example, a method is provided of deploying solar cells, comprising stowing a cover glass having solar cells thereon, and deploying the cover glass from a stowed position thereof closely overlying an array of micro-electromechanical systems (MEMS) based reflectors, to a deployed position in which the cover glass is spaced above the array of MEMS based reflectors at a focal length of the MEMS-based reflectors.

The features, functions, and advantages can be achieved independently in various examples of the present disclosure or may be combined in yet other examples in which further details can be seen with reference to the following description and drawings.

BRIEF DESCRIPTION OF THE DRAWINGS

The novel features believed characteristic of the illustrative examples are set forth in the appended claims. The illustrative examples, however, as well as a preferred mode of use, further objectives and advantages thereof, will best be understood by reference to the following detailed description of an illustrative example of the present disclosure when read in conjunction with the accompanying drawings, wherein:

FIG. 7 is an illustration of a cross-sectional view of the micro-concentrator module in its collapsed, stowed condition, taken along the line 7-7 in FIG. 6.

FIG. 8 is an illustration similar to FIG. 7, but showing the micro-concentrator module in its expanded, deployed condition.

DETAILED DESCRIPTION

Figure 1:
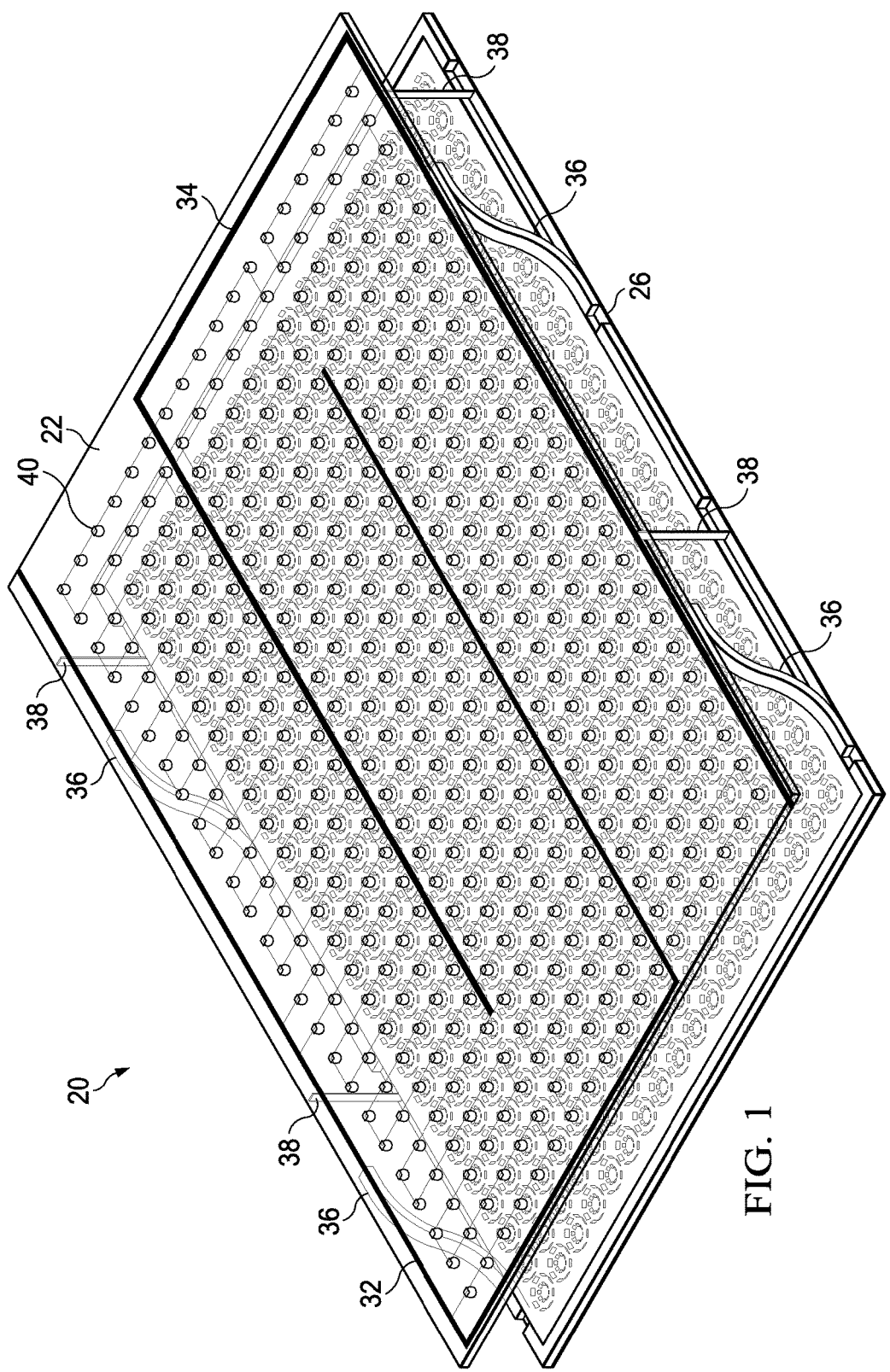
FIG. 1 is an illustration of a perspective view of a micro-concentrator module, shown in a deployed condition.
Figure 2:
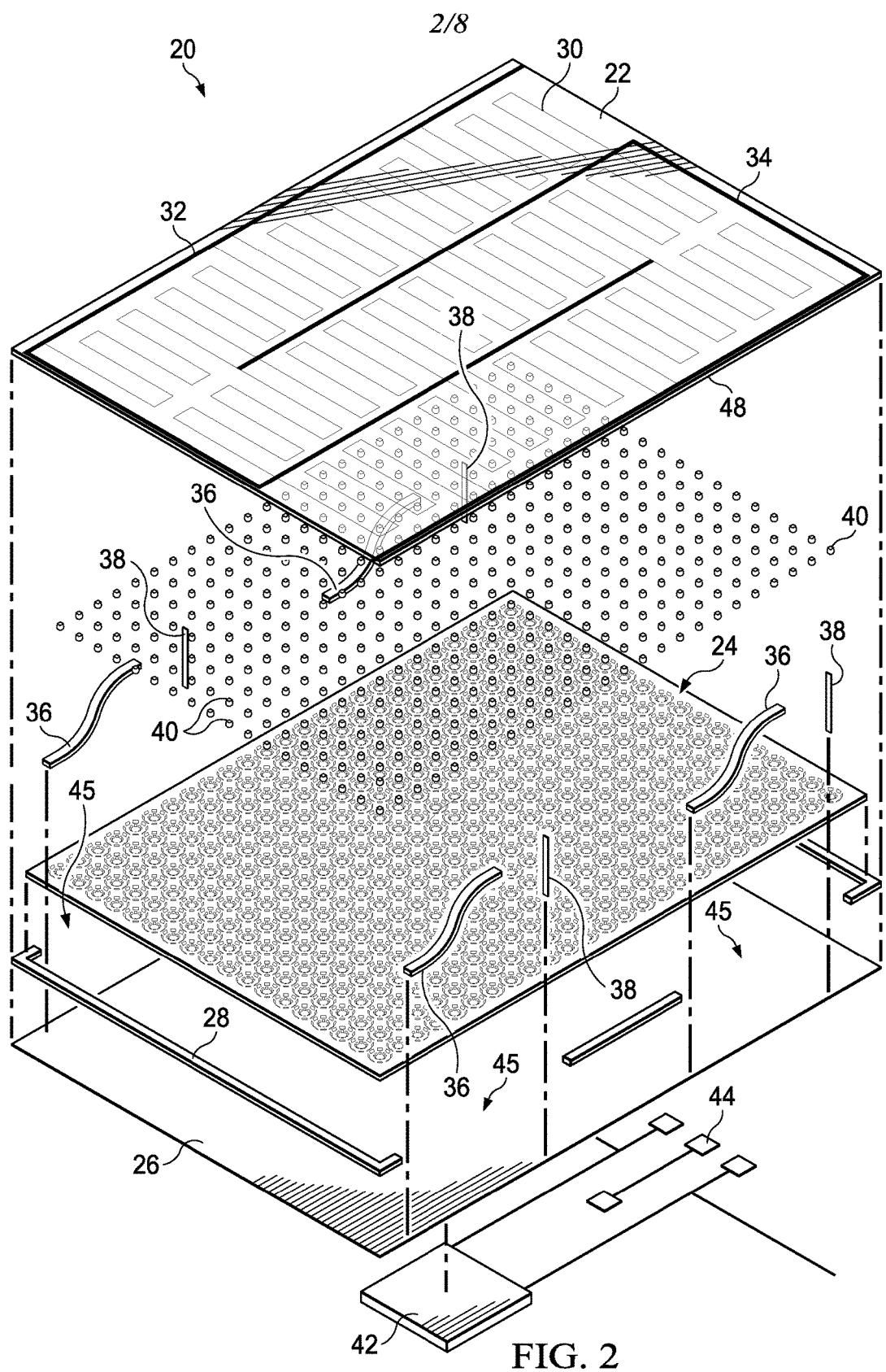
FIG. 2 is an illustration of an exploded, perspective view of the micro-concentrator module shown in FIG. 1.

Referring first to FIGS. 1 and 2, a deployable microconcentrator solar module (MCM) 20 broadly comprises a substantially flat, transparent cover glass 22, an array of solar cells 40, an array 24 of MEMS based mirrors or reflectors and a substrate such as, without limitation, a printed wiring board (PWB) 26. The array of MEMS based reflectors 24 is located on the top side of the PWB 26. The bottom side of the PWB 26 contains electrical circuit traces 44 and electronic components, including an application specific integrated circuit (ASIC) 42 which controls the MCM module 20, including the collection and processing of electrical power generated by the solar cells 40. A damping pad 28 is mounted on and extends along the outer perimeter of the PWB 26, surrounding the MEMS based reflectors 24.

A plurality of springs, such as, without limitation, leaf springs 36 are connected between the bottom side of the cover glass 22 and the underlying printed wiring board 26. In the illustrated example, four of the leaf springs 36 are respectively located generally at the four corners of the MCM module 20, however it may be possible in other examples to use as few as three or greater than four of the leaf springs 36. The leaf springs may be formed of any suitable electrically conductive spring material, such as for example, beryllium copper (BeCu) spring wire. As will be discussed later in more detail, the leaf springs 36 bias the cover glass 22 to move away from the PWB 26 from a stowed position, to a deployed position (FIG. 1) in which the cover glass 22 is spaced from and hovers above the PWB 26, such that the solar cells 40 are respectively positioned at the focal length of the MEMS based reflector array 24. Once deployed, the leaf springs 36 support the cover glass 22 on the PWB 26.

The MCM module 20 further comprises a plurality of flexible, collapsible tethers 38 between the PWB 26 and the cover glass 22. In the illustrated example, four of the tethers 38 are respectively located generally at the corners of the MCM module 20 adjacent the leaf springs 36, however in other examples, as few as three or more than four of the tethers 38 may be employed, provided that they maintain the cover glass 22 in substantially parallel relationship to the MEMS based reflector array 24 after the deployment. Each of the tethers 38 has a length that is related to the focal length FL (see FIG. 8) of the MEMS based reflector array 24. The tethers 38 function to restrain and thereby limit movement of the cover glass 22 during its deployment to a predetermined distance which is related to the focal length FL. By deploying the cover glass 22 at this predetermined distance from the PWB 26, the radiation reflected by the reflectors in the MEMS based reflector array 24 converges at, and is concentrated on the solar cells 40, thereby maximizing the amount of incident radiation 52 (FIG. 5) that is converted into electrical energy by the MCM module 20. The tethers 38 may comprise, for example and without limitation, thin strips of flexible, collapsible film formed of a material suitable for the application. Each of the tethers 38 has its opposite ends attached, as by adhesive bonding respectively to the PWB 26 and the bottom side 48 of the cover glass 22.

In one example suitable for deep space environments, the tethers 38 may comprise, for example and without limitation, a polyimide film sold under the trademark black Kapton® or a multifilament yarn spun from a thermoplastic liquid crystal polymer sold under the trademark Vectran®.

The damping pad 28 may be formed of a suitable foam or a similar shock absorbing, dampening material. For example and without limitation, the damping pad 28 may comprise a polyimide foam, such as one sold under the trademark Solimide®, or similar polyimide open cell foam, having a width and thickness suitable for the application. The damping pad 28 extends around the perimeter of the MCM module 20, surrounding the MEMS based reflector array 24. In the illustrated example, the damping pad 28 is discontinuous strip, having interruptions 45 within which the leaf springs 36 and tethers 38 are located. However, in other examples, the damping pad 28 may be a continuous strip, in which case the leaf springs 36 and tethers 38 may be located in-board of the damping pad 28. In still other examples, the damping pad 28 may comprise a plurality of individual pad-like cushions distributed around the perimeter of the PWB 26, and aligned beneath the outer perimeter of the overlying cover glass 22. In the stowed condition of the MCM module 20, the damping pad 28 is sandwiched between the PWB 26 and the cover glass 22, and functions to absorb acoustic and/or mechanical vibrations imposed on the MCM module 20, as may occur during spacecraft launch. The damping pad 28 also supports the cover glass in spaced relationship above the array 24 of reflectors when the cover glass 22 is stowed.

Referring now to FIGS. 1-3 and 6, the solar cells 40 are located on the bottom side 48 (FIG. 3) of the cover glass 22, and in the illustrated example, are arranged in a grid of fifteen sub-arrays 35 (see FIG. 6), each containing thirty of the solar cells 40. In other examples, more or fewer subarrays 35 and solar cells 40 may be employed. The solar cells 40 in each of the sub-arrays 35 are electrically coupled with each other by electrical circuit traces or interconnects 30 formed on the bottom side 48 of the cover glass 22. In some examples, each of the solar cells 40 may include a lens-like optical element 46 (FIG. 3) that functions to concentrate incident solar radiation on the solar cells 40. As will be discussed below in connection with FIGS. 7 and 8, actuators 75 having plungers 75a may engage the top side 50 of the cover glass to maintain the MCM module in its stowed condition until ready for deployment.

Figure 4:
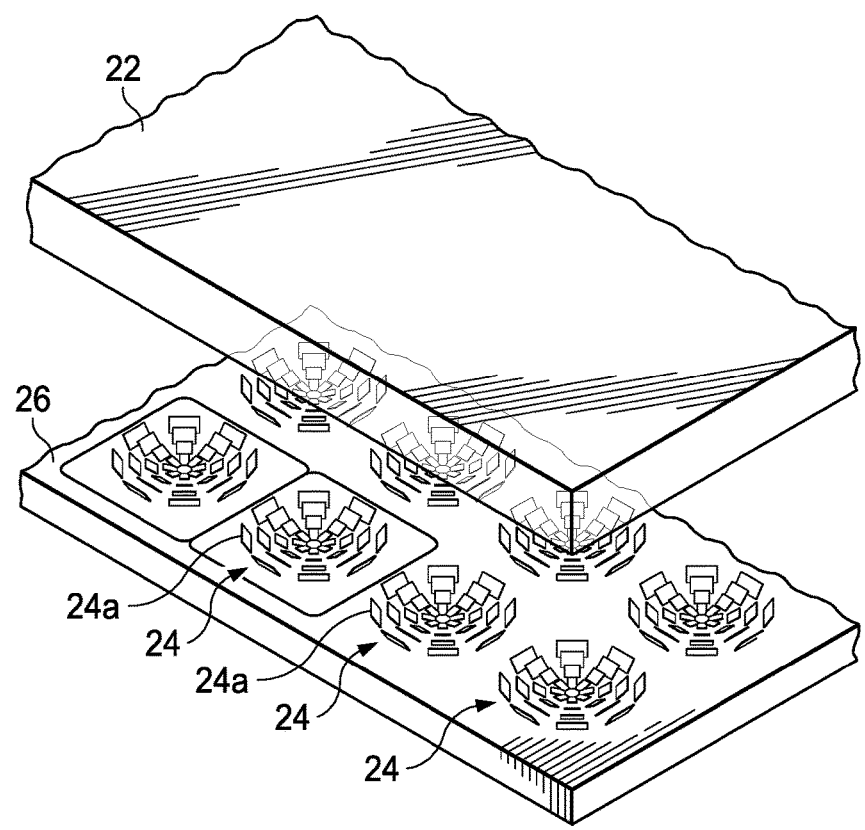
FIG. 4 is an illustration of a fragmentary, perspective view showing the configuration of the array of MEMS based concentrators on the substrate.
Figure 5:
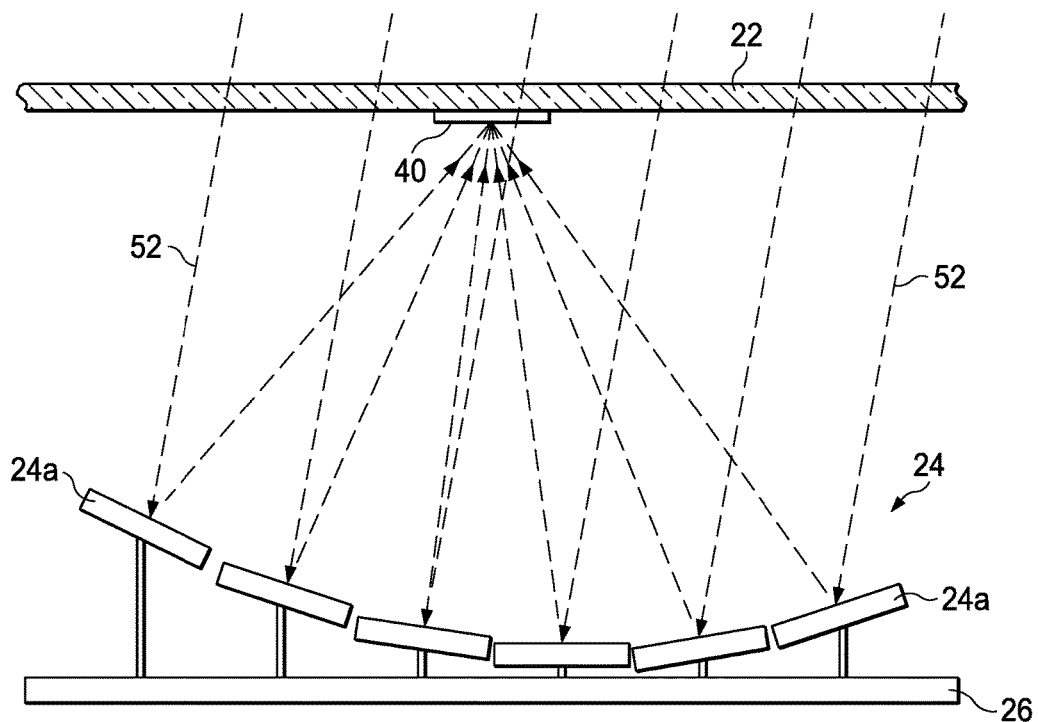
FIG. 5 is an illustration of a diagram showing how the mirrors of one of the MEMS based micro-concentrators may be repositioned to maintain reflection of incident light at a focal point on a solar cell.

Referring to FIGS. 4 and 5, the MEMS based reflector array 24 comprises a plurality of mirror-like reflectors 24a that may be individually tilted and displaced as needed in order to reflect incident radiation 52 passing through the transparent cover glass 22 and focus the reflected radiation on a corresponding one of the corresponding solar cells 40. As previously discussed, by positioning the cover glass 22 a predetermined distance from the PWB 26, the reflected radiation converges to a focal point corresponding to the location of the solar cell 40, thereby maximizing the amount of radiation impinging upon the solar cell 40.

Figure 6:
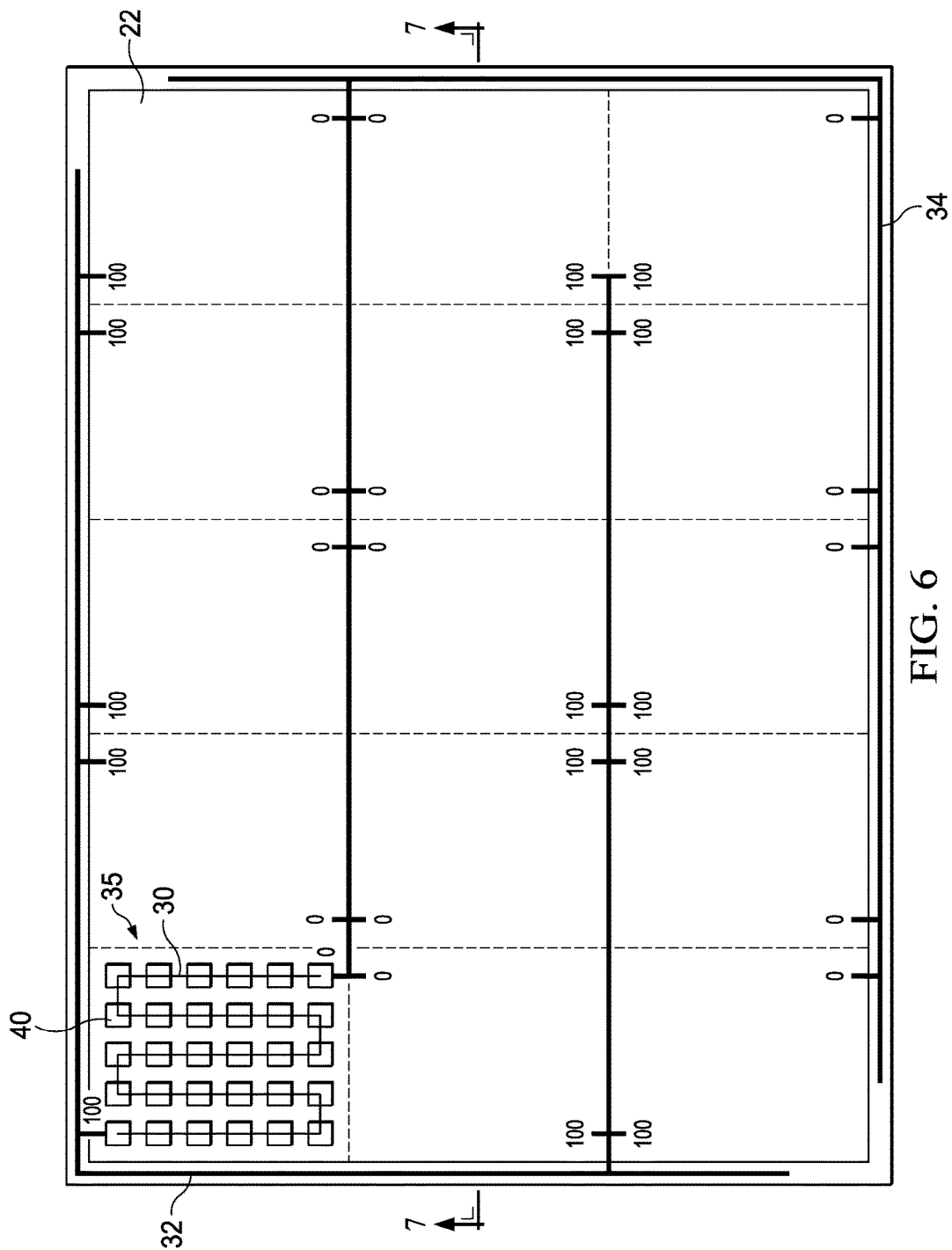
FIG. 6 is an illustration of a plan view of the cover glass showing one subarray of solar cells and bus bars connected to the solar cells, the remaining arrays of solar cells not shown for clarity.

As shown in FIGS. 1, 2 and 6, first and second bus bars 32, 34 comprising electrical traces, are located on the bottom side 48 of the cover glass 22. The bus bars 32, 34 are coupled with the electrical interconnects 30 in each sub-array 35 of the solar cells 40, and function to collect the electrical energy generated by the solar cells 40. As will be discussed below, the electrical energy collected by the bus bars 32, 34 are delivered through the electrically conductive leaf springs 36 to the PWB 26 for processing. The use of the leaf springs 36 as flexible electrical connections between the cover glass 22 and the PWB 26 eliminates the need for separate wire connections between the cover glass 22 and the PWB 26.

Attention is now directed to FIGS. 7 and 8 which respectively show the MCM module 20 in its stowed and deployed conditions, wherein the MCM module 20 is mounted on an underlying panel 54. The PWB 26 is electrically connected to electrical power and data traces (not shown) on top of the panel 54 by welds 56. In its stowed position, the cover glass 22 is closely spaced from the PWB 26, and the periphery of the cover glass 22 is held against the damping pad 28. A later discussed force applicator 75 holds the cover glass 22 against movement to its deployed position by the leaf springs 36. As can be seen in FIG. 7, prior to deployment, the leaf springs 36 are compressed and the tethers 38 are collapsed. During spacecraft launch or vehicle transport, the damping pad 28 absorbs/damps shock and/or vibration, thereby preventing damage to the cover glass 22, leaf springs 36 and other components of the MCM concentrator module 20.

Figure 3:
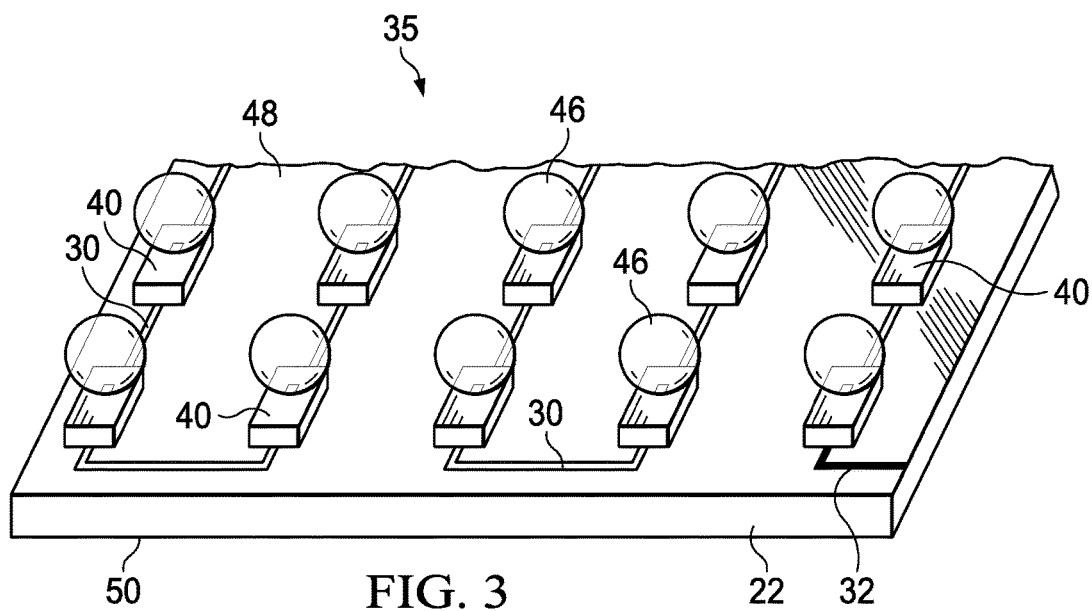
FIG. 3 is an illustration of a fragmentary, perspective view of a portion of the bottom side of the cover glass forming part of the micro-concentrator module in FIGS. 1 and 2, showing the solar cells.
Figure 8A:
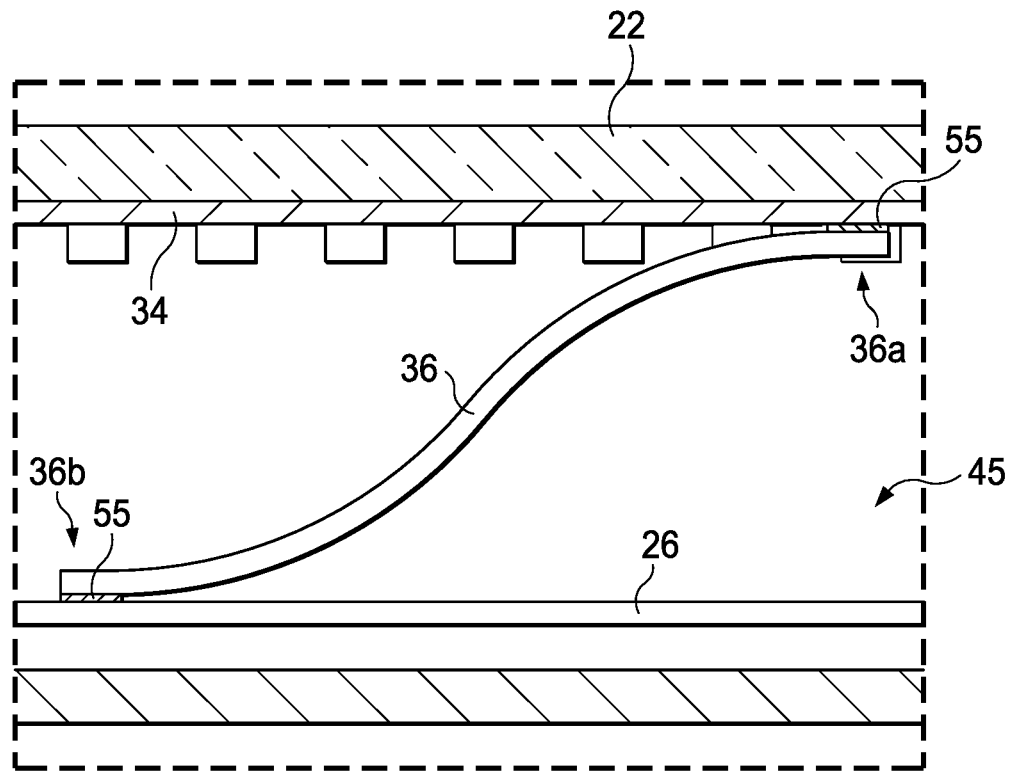
FIG. 8A is an illustration area of the area designated as "FIG. 8A" in FIG. 8.

Referring now particularly to FIGS. 8 and 8A, the upper end 36a of each of the leaf springs 36 is connected as by a weld 55 to one of the bus bars 32, 34 (FIGS. 1-3). The opposite end 36b of each of the leaf springs 36 is likewise connected by a weld 55 to circuit traces (not shown) on the PWB 26. Alternatively, the opposite ends 36a, 36b may be mechanically and electrically connected to the bus bars 32, 34 and the PWB 26 by soldering, riveting or other known techniques. The leaf springs 36 thus act as an electrical connection between the array of solar cells 40 on the cover glass 22 and electrical circuitry on the PWB 26.

In use, prior to vehicle launch or transport, the cover glass 22 is pushed down toward the PWB 26 either manually or by an automated force applicator 75. The force applicator 75 may comprise, for example and without limitation, a suitable electrical, pneumatic, or hydraulic actuator (not shown). Alternatively, the force applicator 75 may comprise another overlying MCM module (not show) forming part of a solar panel array (not shown) that unfolds and moves away from the MCM module 20 when the solar panel array is deployed. When the MCM concentrator module 20 is ready for use (deployment), the force applicator 75 is de-actuated, thereby removing the force that maintains the module 20 in its stowed condition. In the solar panel array example described above, unfolding of the solar panels releases the cover glass 22, allowing it to move away from the underlying PWB 26. With the force applicator 75 de-actuated, the biasing influence of the leaf springs 36 causes displacement of the cover glass 22 upwardly away from the PWB 26. As the cover glass 22 moves upwardly, the tethers 38 unfold and extend. When the tethers 38 are fully extended and tensioned as a result of the force applied to the cover glass 22 by the leaf springs 36, the tethers 38 to restrain the cover glass 22 against further movement. It should be noted here that during the deployment, the cover glass 22 translates in a slight arc as it moves away from the PWB 26 to its deployed position. However, once deployed, the cover glass 22 is precisely positioned relative to the PWB 26, with solar cells 40 aligned above the MEMS based reflector array 24 at the focal length "FL" (FIG. 8) of the MEMS based reflector array 24. After deployment, the leaf springs 36 function as electrical connections between the solar cells 40 and a PWB 26 as well as support the cover glass 22 on the PWB 26.

Figure 9:
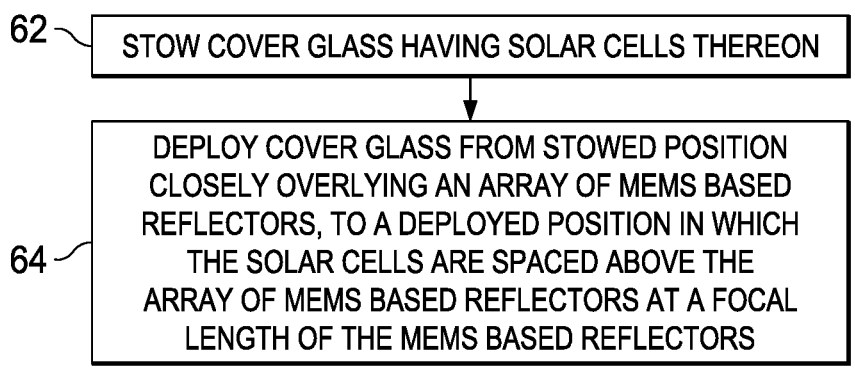
FIG. 9 is an illustration of a flow diagram of a method of deploying solar arrays.

FIG. 9 broadly illustrates a method of deploying solar cells 40. At 62, a cover glass 22 having solar cells 40 thereon is stowed. For example, the cover glass 22 may be stowed in close proximity to an array 24 of underlying MEMS based reflectors. At 64, the cover glass 22 is deployed from its stowed position closely overlying an the array 24 of MEMS based reflectors, to a deployed position in which the solar cells 40 are spaced above the array at a focal length of the reflectors.

Figure 10:
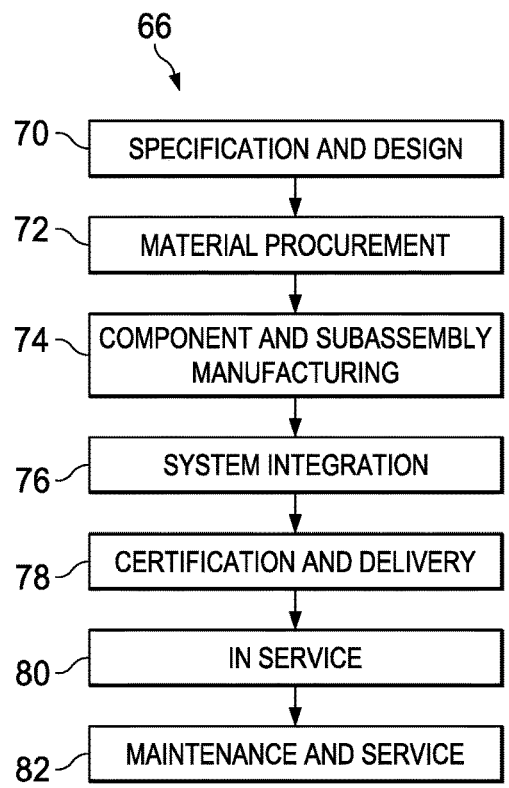
FIG. 10 is an illustration of a flow diagram of aircraft production and service methodology.

Examples of the disclosure may find use in a variety of potential applications, particularly in the transportation industry, including for example, aerospace, marine, automotive applications and other application where solar collectors are mounted on vehicles, such as, without limitation, spacecraft. Thus, referring now to FIGS. 10 and 11, examples of the disclosure may be used in the context of a spacecraft manufacturing and service method 66 as shown in FIG. 10 and a spacecraft 68 shown in FIG. 11. Spacecraft applications may include, for example, without limitation, MCM concentrator modules, comprising arrays of solar cells. During pre-production, exemplary method 66 may include specification and design 70 of the spacecraft 68 and material procurement 72. During production, component and subassembly manufacturing 74 and system integration 76 of the spacecraft 68 takes place. Thereafter, the spacecraft 68 may go through certification and delivery 78 in order to be placed in service 80. While in service by a customer, the spacecraft 68 is scheduled for routine maintenance and service 82, which may also include modification, reconfiguration, refurbishment, and so on.

Each of the processes of method 66 may be performed or carried out by a system integrator, a third party, and/or an operator (e.g., a customer). For the purposes of this description, a system integrator may include without limitation any number of spacecraft manufacturers or major-system subcontractors; a third party may include without limitation any number of vendors, subcontractors, or suppliers; and an operator may be an airline, leasing company, military entity, service organization, and so on.

Figure 11:
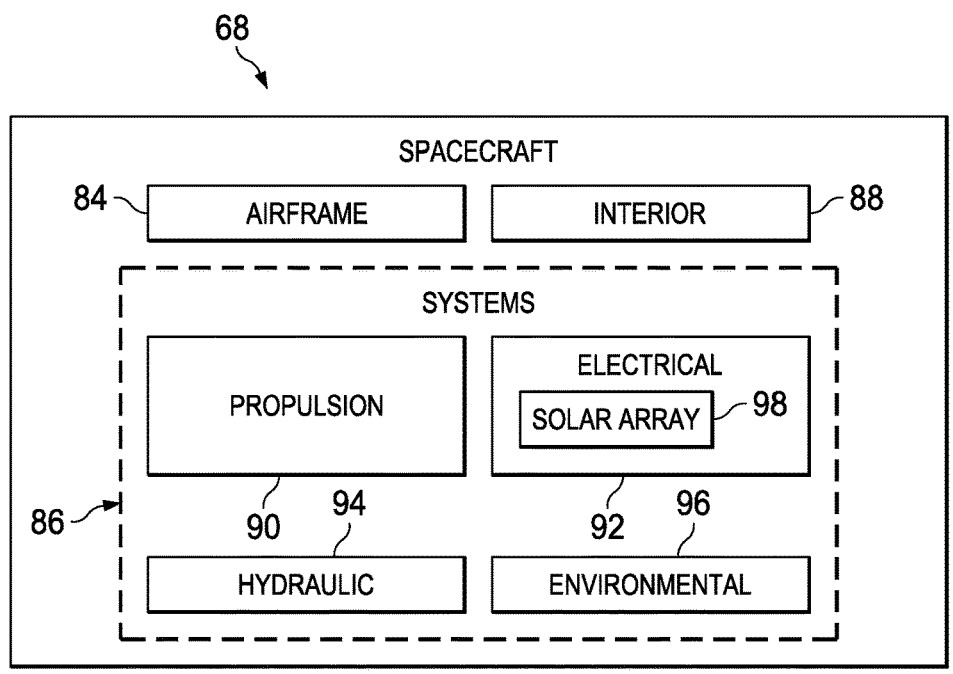
FIG. 11 is an illustration of a block diagram of an aircraft.

As shown in FIG. 11, the spacecraft 68 produced by exemplary method 118 may include an airframe 84 with a plurality of systems 86 and an interior 88. Examples of high-level systems 86 include one or more of a propulsion system 90, an electrical system 92, a hydraulic system 94 and an environmental system 96. Any number of other systems may be included. Although an aerospace example is shown, the principles of the disclosure may be applied to other industries, such as the marine and automotive industries.

Systems and methods embodied herein may be employed during any one or more of the stages of the production and service method 66. For example, components or subassemblies corresponding to production process 74 may be fabricated or manufactured in a manner similar to components or subassemblies produced while the spacecraft 68 is in service. Also, one or more apparatus examples, method examples, or a combination thereof may be utilized during the production stages 74 and 76, for example, by substantially expediting assembly of or reducing the cost of a spacecraft. Similarly, one or more of apparatus examples, method embodiments, or a combination thereof may be utilized while the spacecraft 68 is in service, for example and without limitation, to maintenance or service 82.

As used herein, the phrase "at least one of", when used with a list of items, means different combinations of one or more of the listed items may be used and only one of each item in the list may be needed. For example, "at least one of item A, item B, and item C" may include, without limitation, item A, item A and item B, or item B. This example also may include item A, item B, and item C or item B and item C. The item may be a particular object, thing, or a category. In other words, at least one of means any combination items and number of items may be used from the list but not all of the items in the list are required.

The description of the different illustrative examples has been presented for purposes of illustration and description, and is not intended to be exhaustive or limited to the examples in the form disclosed. Many modifications and variations will be apparent to those of ordinary skill in the art. Further, different illustrative examples may provide different advantages as compared to other illustrative examples. The example or examples selected are chosen and described in order to best explain the principles, the practical application, and to enable others of ordinary skill in the art to understand the disclosure for various examples with various modifications as are suited to the particular use contemplated.

What is claimed is:

1. A micro-concentrator module, that comprises:
   a cover glass;
   a printed wiring board that comprises:
      on a side, which faces the cover glass, of the printed wiring board, an array of micro-electromechanical systems (MEMS) based reflectors;
      on a side, which faces away from the cover glass, of the printed wiring board, an electrical power trace that powers the printed wiring board;
   a panel that comprises, on a side, which faces the printed wiring board, first welds that connect the panel to the printed wiring board and support a space between the printed wiring board and the panel;
   an application specific integrated circuit configured to control the micro-concentrator module and mounted, within the space, to the side, which faces away from the cover glass, of the printed wiring board;
   a plurality of solar cells located on one side of the cover glass and configured to stow adjacent to and deploy to hover at a distance over the array of MEMS based reflectors; and
   an electrical connection coupled to:
      via second welds, the side, which faces the cover glass, of the printed wiring board;
      via third welds, to a bus bar connected to an electrical circuit trace connected to a sub-array of the plurality of solar cells, such that the bus bar forms a continuous trace along a width and a length of a perimeter of the cover glass, the electrical connection configured:
         to compress;
         comprising a bias to expand until restrained by a tether connected to the printed wiring board and to the cover glass; and
         support a separation between the cover glass and the printed wiring board that sustains the distance between the plurality of solar cells and the array of MEMS based reflectors; and
      a damping pad mounted as a discontinuous strip aligned along a perimeter of the side, which faces the cover glass, of the printed wiring board, such that with the electrical connection fully compressed the cover glass contacts the damping pad and maintains the cover glass in a spaced relationship above the array of MEMS based reflectors.

2. The micro-concentrator module of claim 1, further comprising:
   the reflectors comprise a focal length, and the tether comprises a length related to the focal length.

3. The micro-concentrator module of claim 1, further comprising:
   a plunger configured to compress the cover glass against the damping pad mounted on the printed wiring board.

4. The micro-concentrator module of claim 1, further comprising the reflectors arranged on the printed wiring board.

5. The micro-concentrator module of claim 1, wherein:
   the printed wiring board comprises an electrical circuit thereon.

6. The micro-concentrator module of claim 1, further comprising the electrical connection located on the perimeter of the printed wiring board.

7. The micro-concentrator module of claim 1, further comprising the tether comprises a strip of collapsible film that comprises first and second ends respectively attached to the cover glass and to the printed wiring board.

8. The micro-concentrator module of claim 1, wherein a plurality of tethers are disposed around the perimeter of the printed wiring board.

9. A micro-concentrator solar array module, that comprises:
   a cover glass;
   a substrate that comprises an array of micro-electromechanical systems (MEMS) based reflectors mounted on a side, which faces the cover glass, of a printed wiring board;
   an application specific integrated circuit configured to control the micro-concentrator solar array module and mounted to a side, which faces away from the cover glass, of the printed wiring board;
   a panel connected to the side, which faces away from the cover glass, of the printed wiring board via first welds that connect the panel to the printed wiring board and support a space that retains the application specific integrated circuit between the printed wiring board and the panel;
   a plurality of solar cells located on one side of the cover glass; and
   a plurality of electrical connections coupled to:
      via second welds, the printed wiring board; and
      via third welds, to bus bars connected to electrical circuit traces connected to sub-arrays of the plurality of solar cells, such that each of the bus bars forms a continuous trace along a distinct width and length of a perimeter of the cover glass;
   each of the electrical connections configured:
      comprising a bias to extend the cover glass from a stowed position to a deployed position that locates the plurality of solar cells a focal length away from the array of MEMS based reflectors;
      to compress, such that the cover glass contacts a damping pad discontinuously aligned along on a perimeter of the substrate, such that with the plurality of electrical connections fully compressed the cover glass contacts the damping pad and maintains the cover glass in a spaced relationship above the array; and
      to deploy to support a separation between the cover glass and the substrate that sustains the focal length between the plurality of solar cells and the array of MEMS based reflectors.

10. The micro-concentrator solar array module of claim 9, further comprising each of the electrical connections comprises a leaf spring.

11. The micro-concentrator solar array module of claim 9, further comprising the stowed position comprising the damping pad sandwiched between the cover glass and the substrate.

12. The micro-concentrator solar array module of claim 9, wherein each of the electrical connections coupled to the substrate via welds.

13. The micro-concentrator solar array module of claim 9, further comprising a plurality of flexible tethers that comprise opposite ends respectively attached to the cover glass and to the substrate, such that each tether of the flexible tethers comprises a length configured to limit movement of the cover glass away from the substrate to the deployed position thereof.

14. The micro-concentrator solar array module of claim 13, wherein each tether of the plurality of flexible tethers comprises: polyimide film, or multifilament yarn spun from a liquid crystal polymer.

15. The micro-concentrator solar array module of claim 9, further comprising:
the electrical circuit traces configured to electrically couple the plurality of solar cells together;
the substrate comprises an electrical circuit configured to process electrical power produced by the plurality of solar cells, and
each of the electrical connections comprises a leaf spring coupled with the electrical circuit on the substrate.

16. A method of deploying solar cells, comprising:
stowing a cover glass, comprising solar cells on one side thereon, in a stowed position comprising the cover glass in contact with a damping pad discontinuously connected around a perimeter of a printed wiring board and maintaining the cover glass in a spaced relationship above an array of micro-electromechanical systems (MEMS) based reflectors on a side, facing the cover glass, of the printed wiring board, via compressing the cover glass into contact with the damping pad, such that an electrical connection, located between bus bars on the cover glass and the printed wiring board, remains clear of the contact between the cover glass and the damping pad, a side, facing away from the cover glass, of the printed wiring board comprising:
an application specific integrated circuit controlling the MEMS; and
an electrical power trace powering the printed wiring board;
each of the bus bars forming a continuous tracing along a distinct width and length of a perimeter of the cover glass;
welding:
a panel to the side, facing away from the cover glass, of the printed wiring board, via first welds that support a space, retaining the application specific integrated circuit, between the printed wiring board and the panel;
the electric connection to the printed wiring board via second welds; and
the electric connection to the bus bars in the cover glass via third welds; and
deploying the cover glass from the stowed position to a deployed position comprising the cover glass spaced above the array at a focal length of the reflectors in the array, via removing compression from the cover glass, and a bias in the electrical connection, moving the cover glass away from the damping pad until tethers, secured to the cover glass and the printed wiring board, limit the bias from moving the cover glass away from the damping pad.

17. The method of claim 16, further comprising:
compressing the cover glass via applying a plunger against a side, opposite the side comprising the solar cells, of the cover glass; and
the electrical connection comprising electrically conductive springs forcing the cover glass away from the MEMS based reflectors.

18. The method of claim 16, further comprising laterally translating the cover glass to a position aligning the solar cells with the MEMS based reflectors.

19. The method of claim 16, further comprising the cover glass comprising a bus bar aligned along a perimeter of the cover glass and connected to an electrical circuit trace connected to a sub-array of the solar cells.

20. The method of claim 16, further comprising the application specific integrated circuit on the opposite side of the printed wiring board comprising electronic components receiving, via the electrical connection, and processing electrical power generated by the solar cells.

* * * * *